United States Patent [19]
Adachi et al.

[11] Patent Number: 5,674,815
[45] Date of Patent: Oct. 7, 1997

[54] OXIDE SUPERCONDUCTOR

[75] Inventors: Seiji Adachi, Urayasu; Hisao Yamauchi, Nagareyama; Shoji Tanaka; Nobuo Mouri, both of Tokyo, all of Japan

[73] Assignees: International Superconductivity Technology Center; Matsushita Electric Industrial Co., Ltd., both of Japan

[21] Appl. No.: 611,974

[22] Filed: Mar. 6, 1996

Related U.S. Application Data

[63] Continuation of Ser. No. 184,132, Jan. 19, 1994, abandoned.

[30] Foreign Application Priority Data

Jan. 21, 1993 [JP] Japan ............... 5-008382

[51] Int. Cl.$^6$ .............. H01B 12/02; H01L 39/12; C04B 35/45
[52] U.S. Cl. .............. 505/776; 505/125; 505/126; 505/785; 252/521; 501/123; 423/604
[58] Field of Search .............. 252/521; 505/125, 505/776, 785, 126; 501/123; 423/604; 502/525

[56] References Cited

U.S. PATENT DOCUMENTS 5,446,017  8/1995  Sakurai et al. ............... 505/125

OTHER PUBLICATIONS

Chemical Abstracts, 1993 Month not known, 120:150531, 120:44191, 119:239946, and 119:214244.
Chemical Abstracts, 1992 Month not known, 119:208789 and 117:37249.
Chemical Abstracts, 1991 Month not known, 115:62297 and 115:267269.
Siegrist, T., et al., "The parent structure of the layered high-temperature superconductors", *Nature*, 334 (Jul. 21, 1988) 231-2.
M. Azuma et al., "Superconductivity at 110K in the Infinite-Layer Compound $(Sr_{1-x}Ca_x)_{1-y}CuO_2$", *Nature*, vol. 356, 30 Apr. 1992, pp. 775-776.
Hiroi et al., "Cupric oxide superconductors in the Sr–Cu–O System", Advances in Superconductivity VI, vol. 1, Springer-Verlag, pp. 285-290. Oct. 1993.
Adachi et al., "(Sr,Ca)–Cu–O Superconductors of '02(n-1)n' Structure", Advances in Supeconductivity VI, vol. 1, Springer-Verlag, pp. 297-300. Oct. 1993.
Physica C (1993) 226-230 Adachi et al.
Physica C (1994) 303-309 Laffez et al.
Letters to Nature, vol. 364, 22 Jul. 1993 pp. 315-317.
Physica C (1991) 441-444 Takano et al.

*Primary Examiner*—Douglas J. McGinty
*Attorney, Agent, or Firm*—Lorusso & Loud

[57] ABSTRACT

An oxide superconductor composed of Cu, O and M (M is Ba, Sr and/or Ca) and including alternately arranged at least one rock-salt structure section and at least one infinite layer structure section, wherein the rock-salt structure section consists of two atomic layers each consisting of O and M and each having an atomic ratio O/M of 1 or less, and the infinite layer structure section consists of alternately arranged, first and second atomic layers. Each of the first atomic layers consists of O and Cu and has an atomic ratio O/Cu of 2, while each of the second atomic layers consists of the element M. The infinite layer structure section may consist of only one first atomic layer.

1 Claim, 12 Drawing Sheets

OXIDE SUPERCONDUCTOR

This is application is a continuation, of application Ser. No.08/184132, filed 19 Jan. 1994, now abandoned.

BACKGROUND OF THE INVENTION

1. Field of the Invention

This invention relates to an oxide superconductor having a superconducting transition temperature Tc higher than liquid nitrogen (Tc$\geq$77 K.).

2. Description of the Related Art

Because of their peculiar characteristics such as zero resistivity, perfect diamagnetism and Josephson effect, superconductors are anticipated to be useful in various applications such as electric power transmission, electric generators, nuclear fusion plasma containment, magnetic leviation trains, magnetic shield and high speed computers.

An oxide superconductor $(La_{1-x}Ba_x)_2CuO_4$ having Tc of about 30 K. was found by Bendonorz and Muller in 1986. Since then, various superconductors such as $YBa_2Cu_3O_x$ (Tc=90 K.), Bi—Sr—Ca—Cu—O (Tc=110 K.) and Tl—Ba—Ca—Cu—O (Tc=125 K.) have been reported. From the standpoint of industrial application, these superconductors have a drawback that the raw material is not available at low cost or is toxic to the human body costs or toxic to human bodies.

Recently, a new superconductor $(Sr_{1-x}Ca_x)_{1-y}CuO_{2+z}$ having Tc of 110 K. was found (M. Azuma et al, Nature, 356, 775 (1992)). This superconductor has a simple crystal structure called "infinite-layer" structure constituted from a Cu-O$_2$ layer and a (Sr/Ca) layer. Such a crystal structure was first found in a compound of $Ca_{0.86}Sr_{0.14}CuO_2$ in 1988 (T. Siegrist et al, Nature, 334, 231 (1988)) and a large number of researchers had tried to prepare a superconductor of the infinite layer structure. The above infinite layer structure superconductor is obtained by a heat treatment of a raw material blend at 1,000° C. for 30 minutes under a super-high pressure of 6 GPa. This treatment is performed in a gold capsule in which $KClO_4$ is incorporated together with the raw material blend. During the heat treatment, $KClO_4$ decomposes to generate oxygen so that the inside space of the capsule is maintained at a high oxygen gas partial pressure. This causes such a layer defect in that part of (Sr/Ca) is deficient and can impart superconductivity. No periodicity or regularity exists in this layer defect.

SUMMARY OF THE INVENTION

The present invention provides an oxide superconductor composed of Cu, O and at least one alkaline earth metal selected from the group consisting of Ba, Sr and Ca. The superconductor includes alternately arranged, at least one rock-salt structure section and at least one infinite layer structure section. The rock-salt structure section consists of two atomic layers each of which consists of O and and the above-mentioned at least one alkaline earth metal and has an atomic ratio O/M (where M represents the alkaline earth metal or metals) of 1 or less, while the infinite layer structure section consists of j-number of first atomic layer and k-number of second atomic layer, wherein j is an integer of 1 or more and k is an integer of O or more provided that when (j+k) is 2 or more the first and second atomic layers are alternately arranged, i.e. j=k or j=k+1. The first atomic layer consists of O and Cu and has an atomic ratio O/Cu of 2, while the second atomic layer consists of the above-mentioned at least one alkaline earth metal. The total number (j+k) of the first and second atomic layers of the infinite layer structure section is preferably 2n−1 wherein n is an integer of 1 or more, i.e. preferably j=k +1.

It is an object of the present invention to provide a novel oxide superconductor having a superconductive transition temperature Tc of 77 K. or more.

Another object of the present invention is to provide a superconductor which is obtainable from easily available raw materials which are not harmful to the human body.

BRIEF DESCRIPTION OF THE DRAWINGS

Other objects, features and advantages of the present invention will become apparent from the detailed description of preferred embodiments of the invention which follows, when considered in light of the accompanying drawings, in which.

DETAILED DESCRIPTION OF THE PREFERRED EMBODIMENTS OF THE INVENTION

Production of Superconductor of $(Sr_{0.7}Ca_{0.3})_{0.9}CuO_{2+z}$ +$KClO_3$:

Powders of $SrCO_3$, $CaCO_3$ and CuO each having a purity of 99 % or more were blended in amounts providing a composition $(Sr_{0.7}Ca_{0.3})_{0.9}CuO_{2+z}$ and calcined at 1,000° C. for 24 hours in an oxygen stream, and the calcined product was pulverized. Such calcination and pulverization steps were repeated several times. The resulting calcined powder was admixed with a quantity ("a" % by weight where "a" is 0.0, 1.00, 2.00, 3.00, 4.00, 5.00 or 6.00) of $KClO_3$ (oxidizing agent) to obtain 7 kinds of precursors. Each precursor was charged in a gold capsule and heat-treated at 930° C. and 5 GPa for 20 minutes using a super-high pressure generator of a hexagonal cubic anvil type. The gold capsule was placed in a graphite sleeve heater through a BN layer. After pressurization through a pyrophyrite, an electric current was fed to the graphite for performing the heat treatment.

Figure 1:
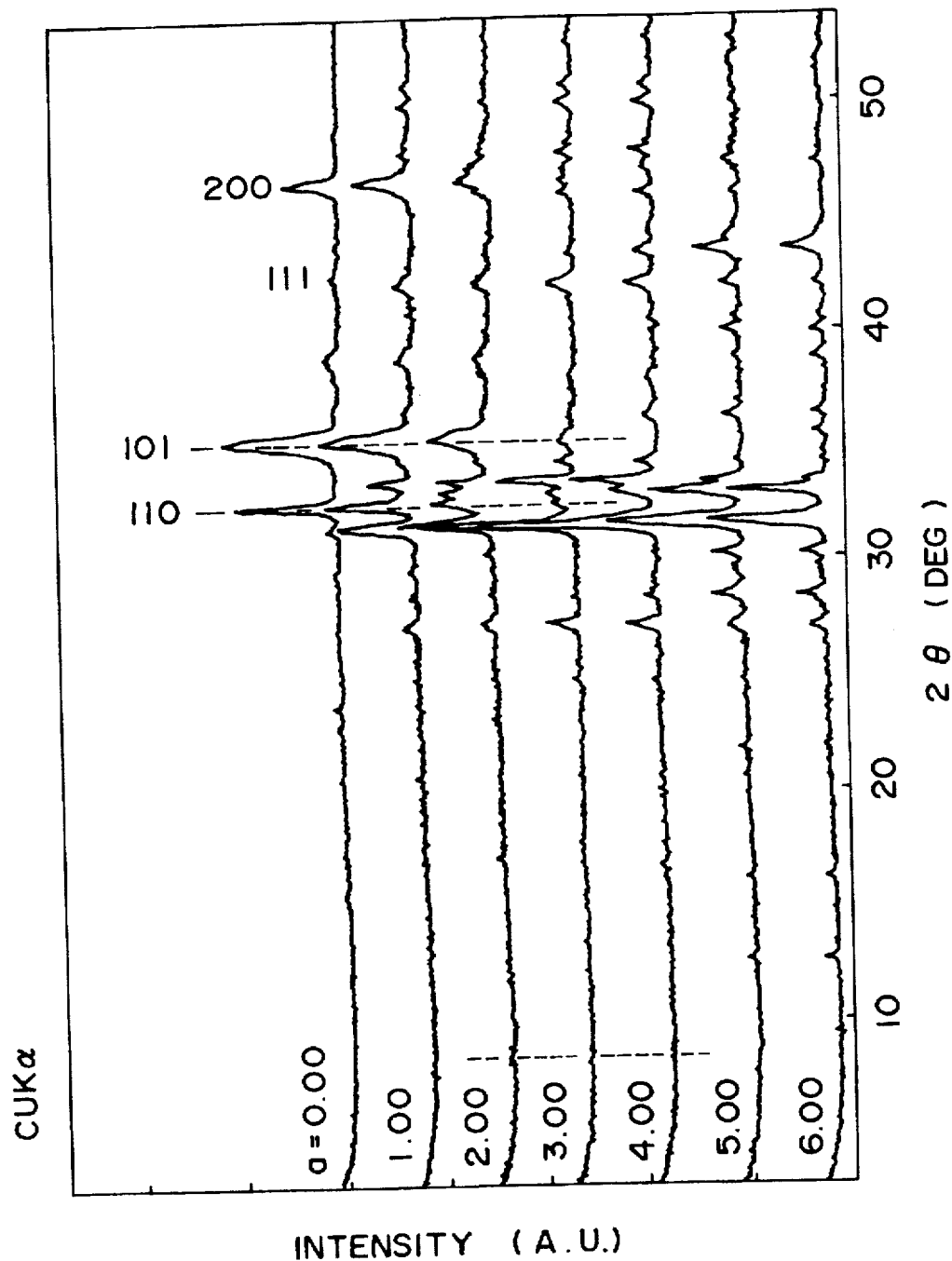
FIG. 1 is a powder X-ray diffraction pattern (using alpha rays of CuK) of a sample of $(Sr_{0.7}Ca_{0.3})_{0.9}CuO_{2+z}$ +"a"% by weight (a=0.0 to 6.0) of $KClO_3$ obtained in one embodiment of the present invention.

FIG. 1 is a powder X-ray diffraction pattern (using alpha rays of CuK) of the thus obtained products. When no oxidizing agent was used (a=0.00), the product had a single layer of an infinite-layer structure. Peaks attributed to impurities appeared when the amount of the oxidizing agent was increased. Thus, with an amount of the oxidizing agent greater than 4 % by weight (a≧4.0), no peaks ascribed to the infinite layer structure were present.

Figure 2:
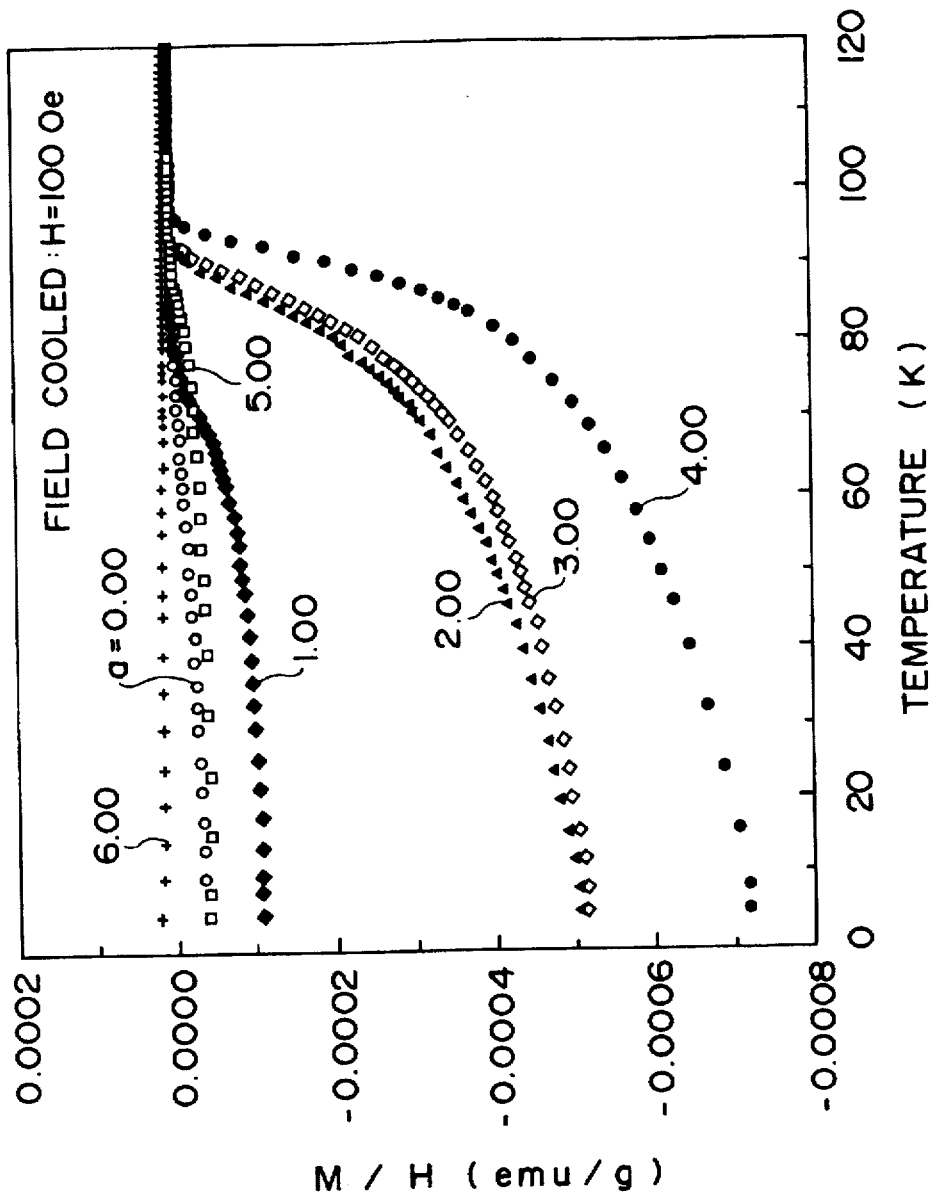
FIG. 2 is a graph showing temperature-magnetic susceptibility characteristics of the sample of FIG. 1.

FIG. 2 is a graph showing temperature-magnetic susceptibility characteristics of the above samples. The measurement was performed using SQUID in the magnetic field of 100 Oe in a cooled condition. Only a weak minor signal was detected in the case of the sample containing no oxidizing agent. The signal intensity increased with the increase in the content of the oxidizing agent and became maximum when the content of the oxidizing agent was 4.0 % by weight (a=4.0). The superconductive volume fraction of this sample (a=4.0) at a temperature of 5 K. is estimated to be about 6 %. When the amount of the oxidizing agent was further increased, the superconductivity was lost.

Since, as described previously with reference to FIG. 1, the peaks attributed to the infinite layer structure are lost when the content of the oxidizing agent is 4.0 % by weight, it is believed that a novel superconductive crystallographic phase other than of an infinite layer structure is present in the sample (Sr—Ca—Cu—O system or Sr—Ca—Cu—O—K—Cl system) obtained using 4.0 % by weight of the oxidizing agent. At present, the infinite layer structure is the only known superconductive crystallographic phase in the Sr—Ca—Cu—O system.

In view of the fact that such a novel superconductive phase is obtained in a highly oxidizing atmosphere and shows high Tc of about 100 K., it is believed that the novel superconductor is a p-type oxide having a $CuO_2$ layer as a conductive layer. Every known p-type oxide superconductor having Tc of higher than 77 K. has a $CuO_2$ layer as a conductive layer and has a periodical structure of 10 A (angstrom) or more in the direction normal to the $CuO_2$ layer. Such a periodical structure gives, in a powder X-ray diffraction pattern thereof, a characteristic peak at a low angle side (2θ<10°). As shown in FIG. 1, samples giving a relatively strong Meissner signal (a=2.0 to 4.0) show small peaks at 2θ of about 8.5°. These peaks are considered to have a relation with the novel superconductive phase.

Figure 3:
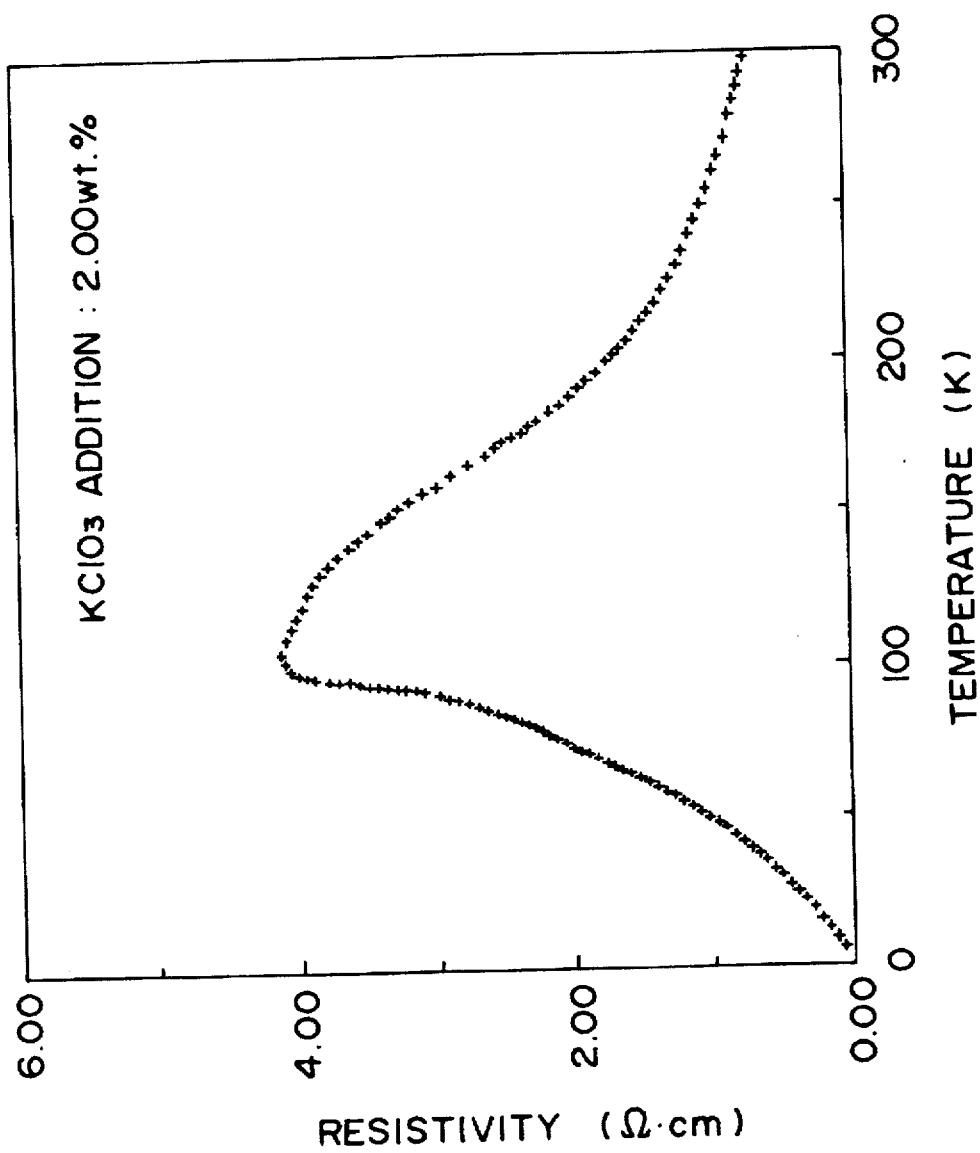
FIG. 3 is a graph showing temperature-specific resistivity characteristics of $(Sr_{0.7}Ca_{0.3})_{0.9}CuO_{2+z}$+2% by weight of $KClO_3$ used in the embodiment of FIG. 1.

FIG. 3 is a graph showing a relationship between the temperature and the specific resistivity of a sample obtained using 2.0 % by weight of the oxidizing agent. As the temperature is lowered from room temperature, the resistivity is increased in a pattern similar to a semiconductor but is decreased at a temperature of about 100 K. or less due to superconductivity. At a temperature of 4.2 K., however, the resistivity is not zero. The reason for this is considered to be because an impurity phase contaminates the superconductive phase of the sample. The formation of such an impurity phase is considered to be attributed to the deposition of KCl formed by the decomposition of $KClO_3$ at the grain boundary during the heat treatment.

Production of Superconductor of front $Sr_{0.6}Ca_{0.333}CuO_{2+z}$:

Powders of $Sr_2CuO_3$, $Ca_2CO_3$, $CaO_2$ and CuO each having a stable phase under ambient pressure were blended in amounts providing a composition $Sr_{0.6}Ca0.333CuO_{2+z}$ (z=0.00, 0.05, 0.10, 0.15 or 0.20) to obtain 5 kinds of precursors. Each precursor was charged in a gold capsule and heat-treated at 930° C. and 5 GPa for 30 minutes. It is reported that homogeneous oxidation may be carried out using $CaO_2$ as both a raw material and an oxidizing agent for the production of a Sr—Ca—Cu—O series p-type superconductor (Adachi et al, 5th International Superconductivity Symposium, ISS's 92, Nov. 16–19, 1992, Kobe, CEP-24). The use of CaO can also avoid the formation of a KCl impurity.

Figure 4:
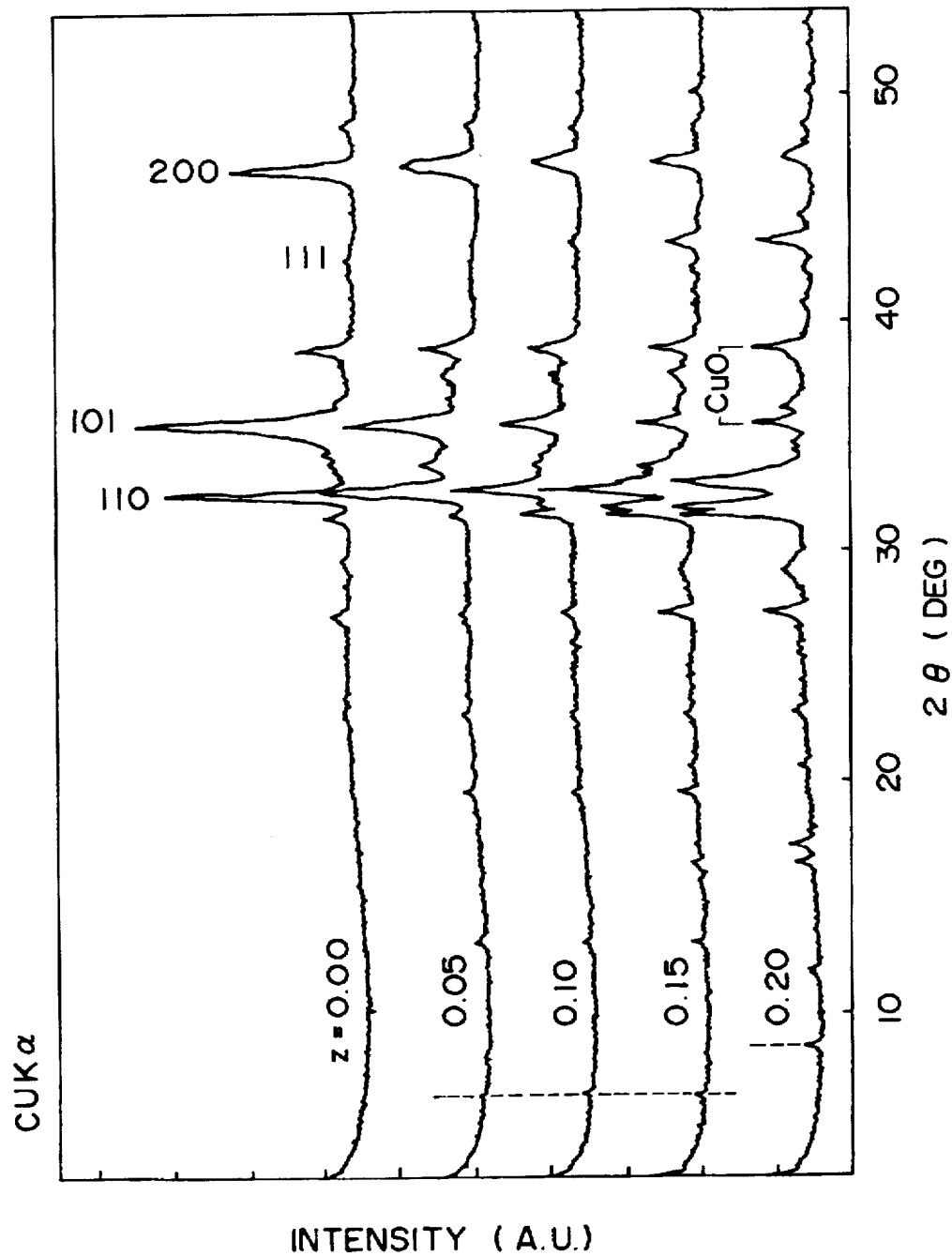
FIG. 4 is a powder X-ray diffraction pattern (using alpha rays of CuK) of a sample of $Sr_{0.6}Ca_{0.333}CuO_{2+z}$ (z=0.00 to 0.20) in another embodiment of the present invention.

The powder X-ray diffraction patterns of the thus obtained samples are shown in FIG. 4. When z is 0.00, the oxide sample shows mixed phases of an infinite layer structure and CuO. With an increase of the oxygen, the peak attributed to the infinite layer structure becomes small. Thus, in the case of the samples having z of 0.05–0.15, a small peak appears at 2θ of 6.5°. When z is 0.20, a peak appears at 2θ of 8.5°. It is also seen that the 101 reflection at 2θ of 35° gradually decreases with an increase of the oxygen content. Since the 101 reflection peak coincides with the main peak of CuO, the 101 peak of the infinite layer structure almost completely disappears when z is 0.10 or more.

Figure 5:
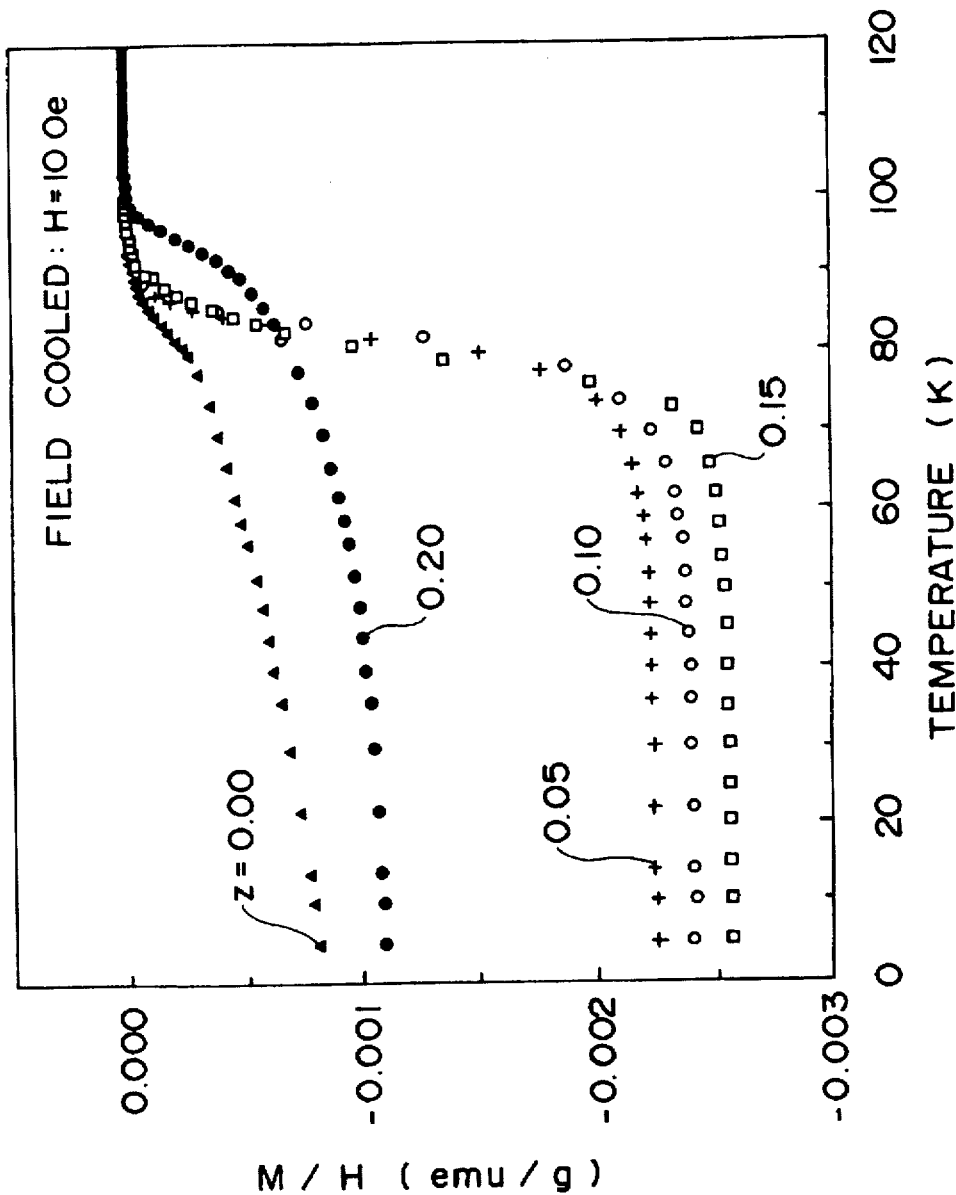
FIG. 5 is a graph showing temperature-magnetic susceptibility characteristics of the sample of FIG. 4.

FIG. 5 is a graph showing temperature-magnetic susceptibility characteristics of the above samples. The measurement was performed in a magnetic field of 10 Oe. A significantly larger Meissner signal was observed as compared with the samples obtained using $KClO_3$ as an oxidizing agent. In particular, the superconductivity volume fraction at 5 K. is as high as 20 % when z is 0.05–0.15. These results indicate that the periodical structure showing the peak at 2θ of 6.5° is a superconductive phase having a high class of Tc of about 90 K. When z is 2.0, the peak at 2θ of 6.5° disappears but a new peak is present at 2θ of 8.5°. This new peak is also considered to be attributed to a novel superconductive phase. The sample having z of 2.0 shows superconductivity (Tc= about 100 K.) and the superconductivity volume fraction at 5 K. thereof is about 10%. The foregoing results indicate that in the Sr—Ca—Cu—O series samples, are is formed novel superconductive phases having periodical structures of 13.6 A and 10.3 A which correspond to the peaks at 2θ of 6.5 and 8.5°, respectively.

Figure 6:
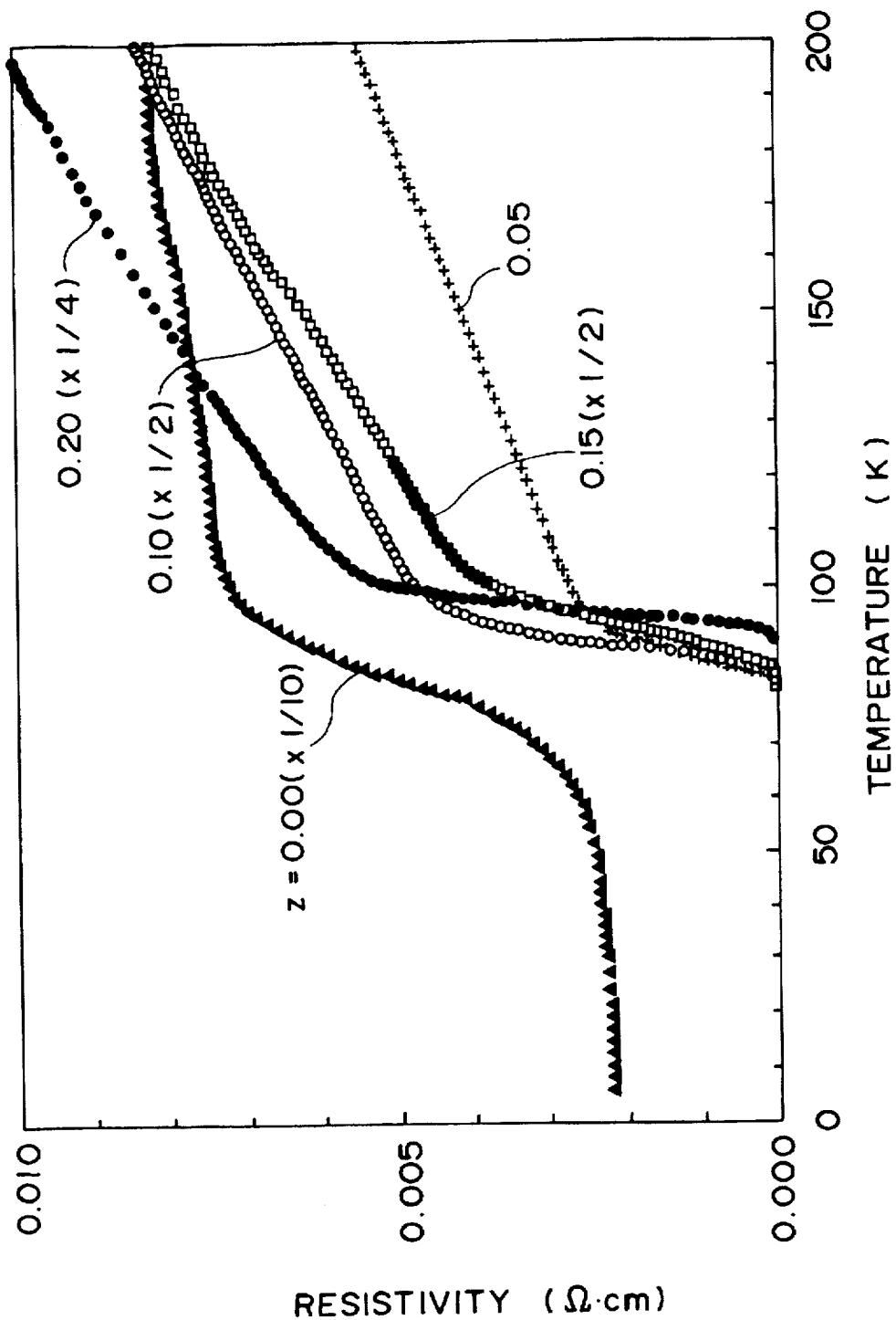
FIG. 6 is a graph showing temperature-specific resistivity characteristics of the sample of FIG. 4.

FIG. 6 shows temperature-specific resistivity characteristics of the above samples. In the case of the samples having z of 0.05 or more, the resistivity decreases in a pattern similar to a metal as the temperature decreases and abruptly decreases around 100 K. At about 80 K., the resistivity becomes zero.

Figure 7:
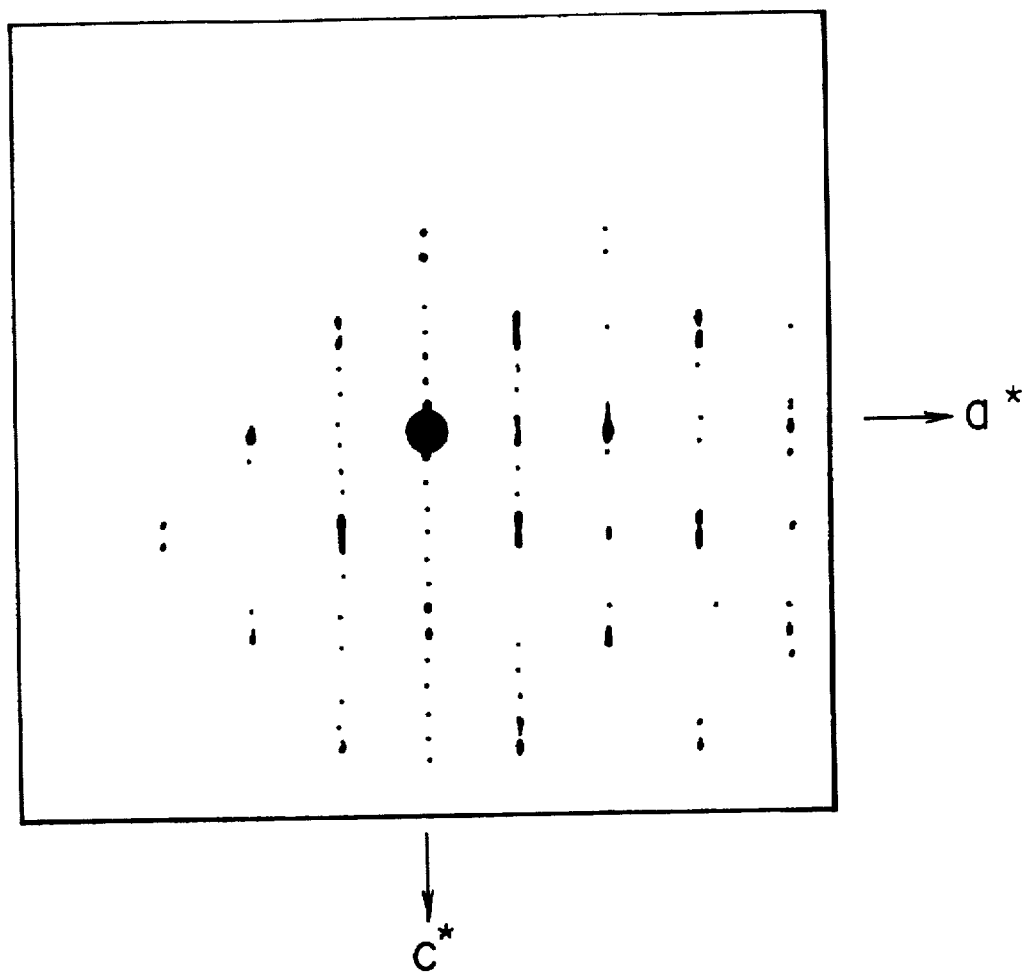
FIG. 7 is an electron beam diffraction pattern of the sample of $Sr_{0.6}Ca_{0.333}CuO_{2.10}$ in the embodiment of FIG. 4.

FIG. 7 is an electron beam diffraction pattern of the sample having z of 0.10. The diffraction image indicates that the superconductive phase showing a peak at 2θ of 6.5° has lattice constants along the a-axis of 3.86 A and along the b-axis of 27.2 A.

Figure 8:
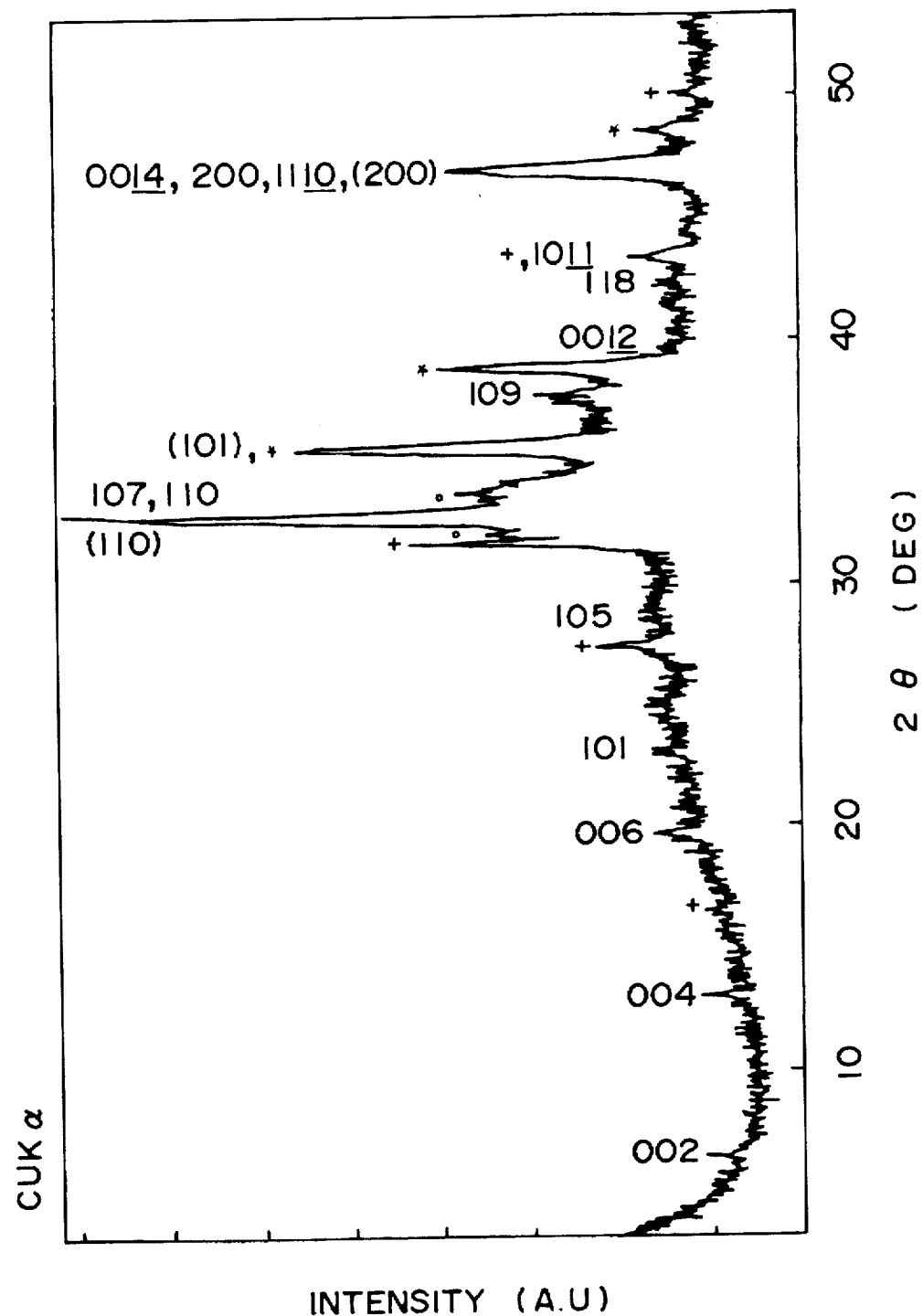
FIG. 8 is a powder X-ray diffraction pattern (using alpha rays of CuK) of the sample of $Sr_{0.6}Ca_{0.333}CuO_{2.10}$ in the embodiment of FIG. 4.

FIG. 8 is a powder X-ray diffraction pattern (indexed) of the sample having z of 0.10. The main phase is the novel superconductive phase. There are impurity phases attributed to CuO (marked with *), the infinite layer structure phase (parenthesized index) and unknown phases (marked with o and +). As described previously, the content of the infinite layer structure phase is very small. Such a small amount of the infinite layer structure phase would not provide a superconductive volume fraction at 5 K. of 20% or more.

Figure 9:
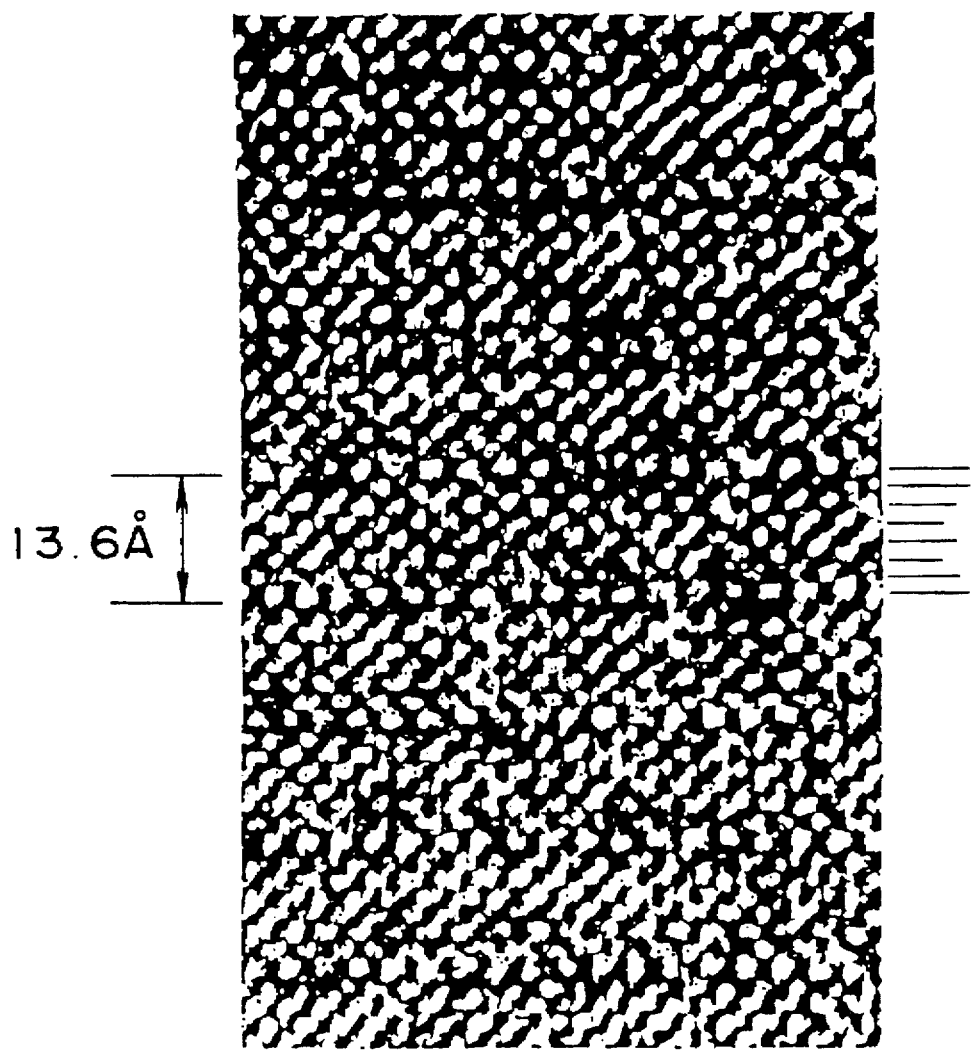
FIG. 9 is a high resolution, transmission electron photomicroscope of the sample of $Sr_{0.6}Ca_{0.333}CuO_{2.10}$ in the embodiment of FIG. 4.

FIG. 9 is a high resolution, transmission electron photomicroscope showing the lattice structure of the sample in which z=0.10. The lattice structure is composed of periodical structure units each having a width of 13.6 A and consisting of seven atomic layers.

The foregoing results suggest that the novel superconductive crystallographic phase has lattice constants of a=3.86 and c=27.2 and is composed of a series of the following 7 atomic layers arranged in the direction normal to the c-axis:

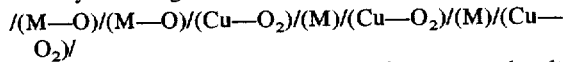
/(M—O)/(M—O)/(Cu—O$_2$)/(M)/(Cu—O$_2$)/(M)/(Cu—O$_2$)/

Figure 10:
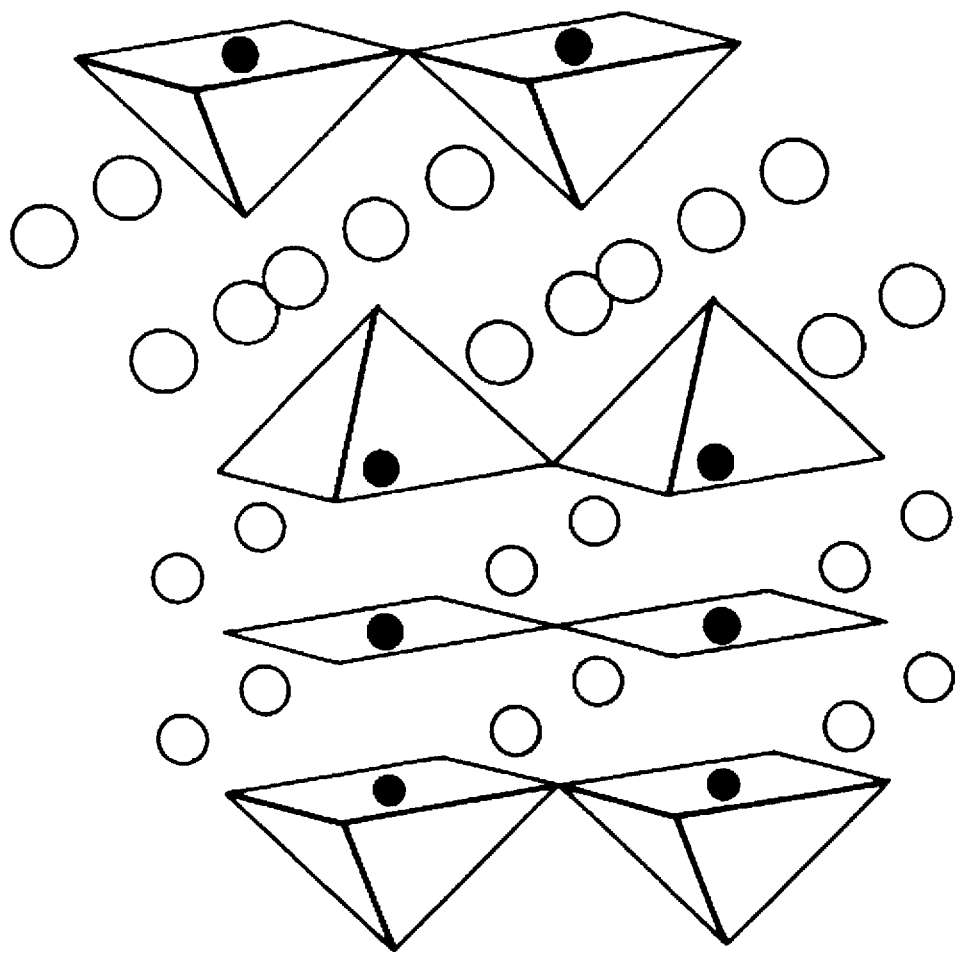
FIG. 10 is a schematic illustration explanatory of the crystal structure of the superconductor of the present invention.

The double layer (M—O)/(M—O) forms a rock-salt structure while the other 5 layers constitute an infinite layer structure. The rock-salt structure section gives the oxygen atoms thereof to the adjacent (Cu—O$_2$) layers so that each of the (Cu—O$_2$) layers forms a (Cu—O$_5$) pyramid which is commonly observed in p-type copper oxide superconductors (other than infinite layer structure superconductors). The crystal structure of the superconductor of the present invention is shown in FIG. 10 in which can circle designates a copper atom and each white circle designates an atom of an alkaline earth metal. Each of the corners or apices is a position at which an oxygen atom is located. The non-stoichiometry of oxygen serves to determine the amount of holes in the (Cu—O$_2$) layers.

Figure 11:
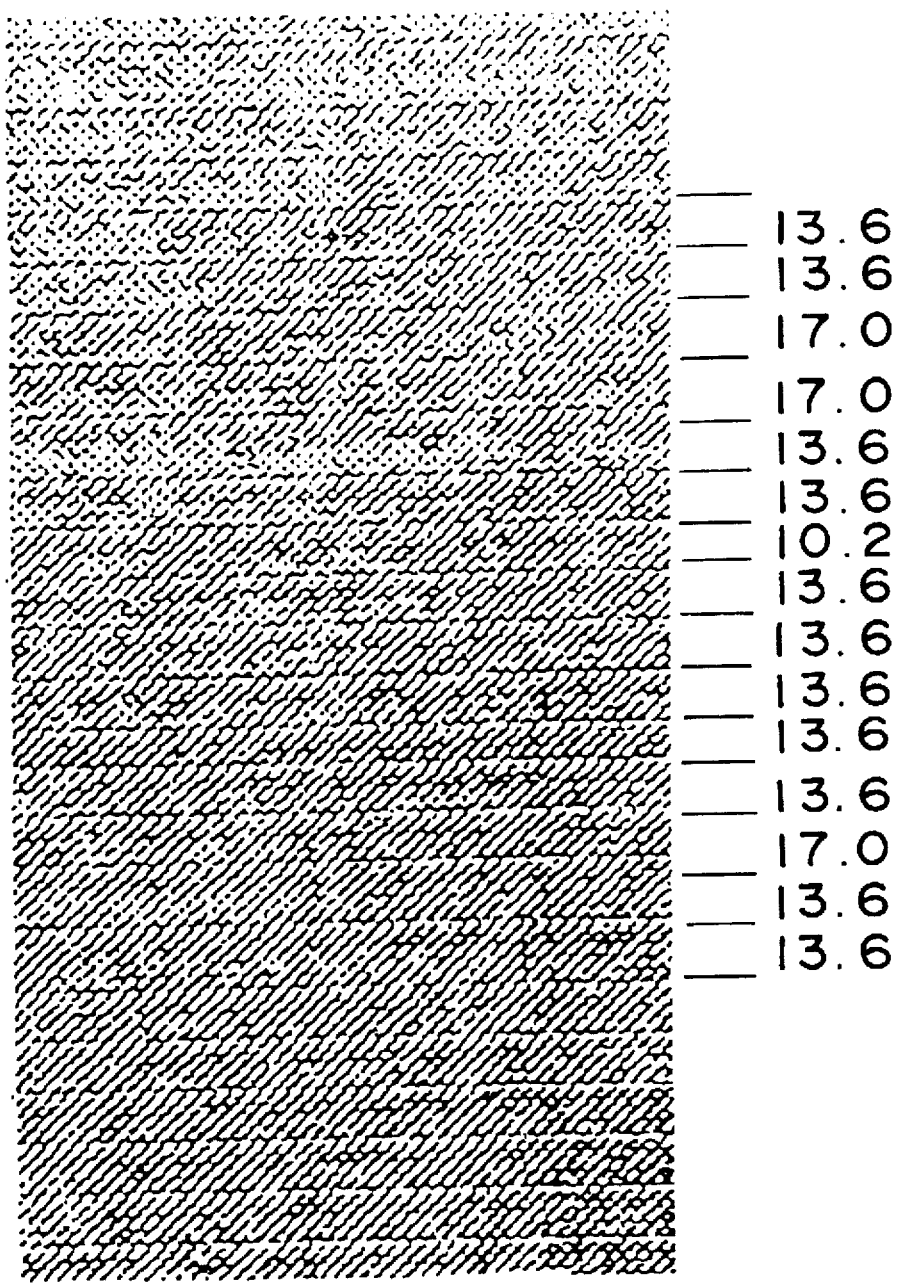
FIG. 11 is schematic illustration of a high resolution, transmission electron photomicroscope of the sample of $Sr_{0.6}Ca_{0.333}CuO_{2.10}$ in the embodiment of FIG. 4.

In view of the similarity to Bi-series or Tl-series superconductors, the novel superconductive phase is considered to include a series of superconductive phases in which the thickness of respective infinite layer structure sections varies by intergrowth. In fact, as seen from FIG. 11 which is a schematic illustration of a high resolution, transmission electron photomicroscope of the sample of $Sr_{0.6}Ca_{0.333}CuO_{2.10}$, a number of lattice defects are observed. The periodical structure of 10.3 Å confirmed in the powder X-ray diffraction pattern of FIG. 4 is a substance having a crystal structure in which one unit lattice portion (two atomic layers of /(M)/(Cu—O$_2$)) is removed from the layer of 13.6 Å, i.e. which is an infinite layer structure section consisting of 3 atomic layers. The present invention also provides a superconductor having a periodical structure of 17.0 Å in which one unit lattice portion is inserted into the infinite layer structure section and which, therefore, consists of 7 atomic layers.

Figure 12:
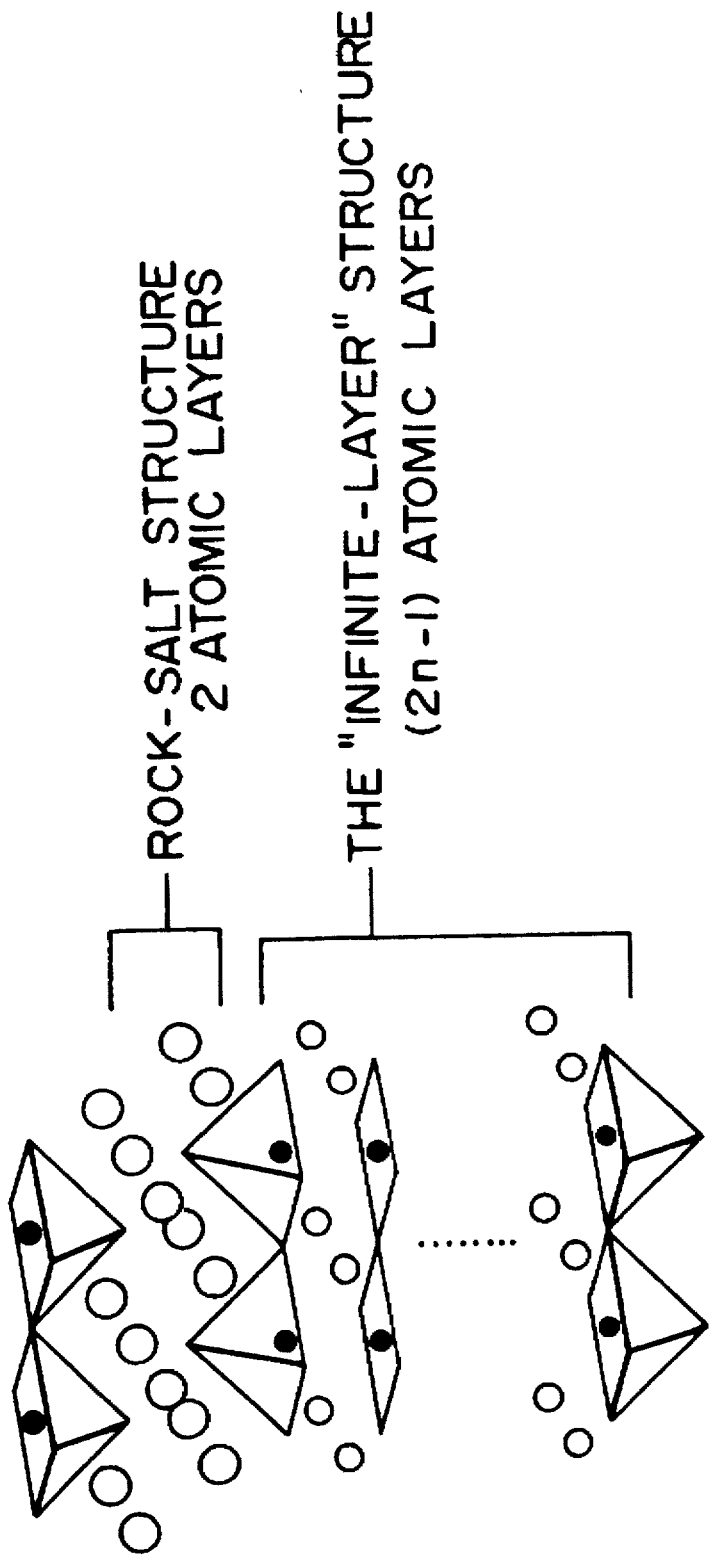
FIG. 12 is an illustration explanatory of the general crystal structure of the superconductor of the present invention.

FIG. 12 is an illustration of the general crystal structure of the superconductor of the present invention. In FIG. 12, each black circle designates a copper atom, each white circle designates an atom of an alkaline earth metal, and each of the corners or apices is a position at which an oxygen atom is located.

Preparation of Other $M_{1-y}CuO_{2+z}$ Superconductors:

Oxides having a composition of $(Sr_{0.7}Ca_{0.3})_{1-y}CuO_{2.10}$ were produced. When (1-y) was greater than 1 (1-y>1.0), the samples obtained showed a superconductive volume fraction at 5 K of 2 % or less. When (1-y) was less than 0.7 (1-y <0.7), the samples contained a plurality of impurities and showed a superconductive volume fraction at 5 K. of 3% or less. Superconductors having a satisfactory superconductive volume fraction were obtained when (1-y) was between 0.7 and 1.

Oxides having a composition of $(Sr_{1-x}Ba_x)_{0.95}CuO_{2.10}$ were produced. When x was between 0 and 0.30 (0 ≦ x ≦ 0.30), novel superconductors having a superconductive volume fraction at 5 K. of more than 10% were obtained. When x exceeded 0.3, the superconductivity was lowered due to the inclusion of a $BaO_2$ impurity phase.

Oxides having a composition of $(Sr_{1-x}Ca_x)_{0.95}CuO_{2.10}$ were produced. When x was between 0 and 0.60 (0 ≦ x ≦ 0.60), novel superconductors having a superconductive volume fraction at 5 K. of more than 10% were obtained. When x exceeded 0.6, the superconductive volume fraction of resulting superconductors was lower than 10% but the infinite layer structure was stabilized.

In the above oxide superconductors of $(Sr.Ca)_{1-y}CuO_{2+z}$ series, satisfactory superconductive volume fractions of 10% or more were obtained when the amount of excess oxygen z was within the range of between 0.02 and 0.24. A value of z below 0.02 was insufficient to provide a superconductive volume fraction of 10% or more because the infinite layer structure was stable. When the value exceeds 0.24, on the other hand, impurities of non-superconductive phases were formed. The foregoing procedures were repeated under various pressures of 1–8 GPa, revealing that these pressures were suited for the production of superconductors of the present invention.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. An oxide superconductor composed of Cu, O and an element M which is at least one alkaline earth metal selected from the group consisting of Ba, Sr and Ca and consisting of alternately and periodically arranged plural rock-salt structure sections and plural infinite layer structure sections, each of said rock-salt structure sections consisting of two M—O atomic layers, each of said M—O atomic layers consisting of O and M and each having an atomic ratio O/M of 1 or less, said infinite layer structure section consisting of j-number and k-number of first and second atomic layers, respectively, wherein j is an integer of 1 or more and k is (i-1), said first and second atomic layers being alternately arranged when (j+k) is 2 more, each of said i-number first atomic layers consisting of O and Cu and having an atomic ratio O/Cu of 2, and each of said k-number second atomic layers consisting of said element M.

* * * * *

UNITED STATES PATENT AND TRADEMARK OFFICE
CERTIFICATE OF CORRECTION

PATENT NO. : 5,674,815
DATED : October 7, 1997
INVENTOR(S) : ADACHI et al

It is certified that error appears in the above-identified patent and that said Letters Patent is hereby corrected as shown below:

Col. 1, line 18, "leviation" should read --levitation--;
      line 26, delete "costs or";
      line 27, delete "toxic to human bodies";
      line 56, "and and" should read --and--.

Col. 3, line 65, delete "front".

Col. 4, line 40, "samples, are is" should read --samples are--.

Col. 5, line 15, delete "can" insert --each black--.

UNITED STATES PATENT AND TRADEMARK OFFICE
CERTIFICATE OF CORRECTION

PATENT NO. : 5,674,815
DATED : October 7, 1997
INVENTOR(S) : ADACHI et al

It is certified that error appears in the above-identified patent and that said Letters Patent is hereby corrected as shown below:

Col. 6, line 13, "$CuO_{2+2}$" should read --$CuO_{2+z}$--;

line 47, "(i-1)" should read --(j-1)--;

line 48, after "two" insert --or--; and line 49, "i-number" should read --j-number--.

Signed and Sealed this

Thirteenth Day of October 1998

Attest:

BRUCE LEHMAN

*Attesting Officer*  *Commissioner of Patents and Trademarks*